(12) United States Patent
Bekaert

(10) Patent No.: US 11,844,196 B2
(45) Date of Patent: Dec. 12, 2023

(54) ELECTRONIC HOUSING ELEMENT COMPRISING A RADIATOR, AND ASSOCIATED ADJUSTMENT METHOD

(71) Applicant: Continental Automotive GmbH, Hannover (DE)

(72) Inventor: Jean-Philippe Bekaert, Toulouse (FR)

(73) Assignee: CONTINENTAL AUTOMOTIVE GMBH, Hannover (DE)

( * ) Notice: Subject to any disclaimer, the term of this patent is extended or adjusted under 35 U.S.C. 154(b) by 225 days.

(21) Appl. No.: 17/498,927

(22) Filed: Oct. 12, 2021

(65) Prior Publication Data

US 2022/0132698 A1 Apr. 28, 2022

(30) Foreign Application Priority Data

Oct. 22, 2020 (FR) ...................................... 2010845

(51) Int. Cl.
*H05K 7/20* (2006.01)
*H05K 13/04* (2006.01)

(52) U.S. Cl.
CPC ....... *H05K 7/2039* (2013.01); *H05K 13/0413* (2013.01)

(58) Field of Classification Search
CPC ............. H05K 7/2039; H05K 7/20845; H05K 7/20154; H05K 7/20854; H05K 13/0413
See application file for complete search history.

(56) References Cited

U.S. PATENT DOCUMENTS

| 10,462,921 | B2* | 10/2019 | Bayerer | ................... H01L 23/10 |
| 2016/0233141 | A1* | 8/2016 | Hirobe | ..................... H01L 23/10 |
| 2020/0068757 | A1 | 2/2020 | Hughes et al. | |

FOREIGN PATENT DOCUMENTS

| JP | 2009076606 A | | 4/2009 | |
| JP | 2013515363 A | * | 5/2013 | |
| JP | 2019087609 A | | 6/2019 | |
| WO | WO-2016092919 A1 | * | 6/2016 | ............. H01L 23/02 |

OTHER PUBLICATIONS

"Buffered Immersion Cooling with Buckling Bellows Providing Barrier Between Chip and System Coolant and Pressure", IBM Technical Disclosure Bulletin, Thornwood, US, Jan. 1, 1990, vol. 32, No. 8A, pp. 168-170, XP000082756.
French Search Report and Written Opinion for French Application No. 2010845, dated Jun. 14, 2021, with partial English translation, 12 pages.

* cited by examiner

*Primary Examiner* — Emmanuel E Duke
(74) *Attorney, Agent, or Firm* — RatnerPrestia

(57) ABSTRACT

An electronic housing element intended to be fastened to a circuit board having a component to be cooled, including: a frame made of plastics material having a rigid surround and an upper wall, and a radiator intended to cool the component, having: a gripping portion protruding from the upper wall of the frame and designed so as to engage with gripping claws of a gripping device, and a holding portion engaging with the upper wall of the frame. The upper wall of the frame is formed from a material that has a deflection temperature under load and is designed to deform in order to allow the orientation of the radiator to be adjusted when the upper wall reaches the deflection temperature under load.

8 Claims, 4 Drawing Sheets

ELECTRONIC HOUSING ELEMENT COMPRISING A RADIATOR, AND ASSOCIATED ADJUSTMENT METHOD

CROSS REFERENCE TO RELATED APPLICATIONS

This application claims priority to French Patent Application No. 2010845, filed Oct. 22, 2020, the contents of such applications being incorporated by reference herein.

FIELD OF THE INVENTION

The present disclosure lies in the field of cooling electronic components in environments that are subject to heavy vibrations in particular, such as in the automotive field for example.

BACKGROUND OF THE INVENTION

In the automotive field, increasingly powerful electronic components are being used, in particular on account of the development of new functionalities such as driving assistance or autonomous driving for example. Therefore, there is a need to provide a solution for cooling these components that can be subject to heavy vibrations while protecting them from their external environment.

The proposed cooling solutions have to make it possible to effectively cool the component while ensuring good integrity of the component and of the circuit board to which the component is fastened. To this end, it is necessary to limit the stress to which the circuit board is subjected, this making it possible in particular to avoid weld breaks or track breaks, and to limit structural weaknesses by using a maximum of rigid connections and avoiding the occurrence of natural resonance frequencies. Furthermore, it is also desirable to limit the production costs by limiting the number of assembly steps and to limit the storage costs by limiting the number of parts to be assembled.

Various solutions have been proposed as attempts to address these problems.

A first solution consists in fastening the circuit board to a base and in enclosing the circuit board and the component to be cooled in a rigid enclosure fastened to the base so as to form an electronic housing. With a radiator intended to be in thermal contact with the component to be cooled being rigidly fastened to the inside of the enclosure, a layer of thermal interface material, such as thermal paste, thermal grease or thermal pads, is placed between the radiator and the component to ensure thermal contact. On account of the mechanical tolerances that exist between the component and the radiator, the thickness of the layer of thermal interface material varies from one electronic housing to another. Consequently, the cooling performance varies, and this can cause overheating of the component or of other sensitive components on the circuit board. Therefore, this solution is not satisfactory in terms of thermal performance.

In order to overcome this drawback, it has been proposed to also screw the radiator to the circuit board on either side of the component to be cooled. Thus, the thickness of the thermal interface material deposited is reproducible and has a controlled thickness. However, this additional mechanical coupling adds an additional load, which can locally bend the circuit board. This second solution is not satisfactory since it brings about an additional stress on the circuit board.

In order to overcome this drawback, it has been proposed, in a third solution, to fasten the radiator directly to the circuit board. This third solution is not satisfactory since it involves an additional sub-assembly step and therefore the storage of additional elements. Furthermore, since the radiator typically weighs around 50 to 200 grams for the intended applications, in the event of vibrations, the welds or the tracks can break. In addition, the circuit board is subjected to a dynamic stress brought about on each vertical acceleration, for example when the vehicle passes through a pothole, this also having an impact on the integrity of the circuit board in terms of cyclic fatigue.

In order to overcome this drawback, it has been proposed, in a fourth solution, to fasten the radiator to the circuit board and to the cover. Since the cover is rigid, this improves the structural stability of the assembly. However, with this solution, the position of the circuit board within the rigid enclosure is difficult to adjust since it is defined by the cover/circuit board/cooler assembly. It is therefore necessary to add new tolerances by enlarging, for example, holes intended to receive connectors in the enclosure of the frame. This solution is not practicable since it is necessary to limit the penetration of solid and liquid foreign objects into the circuit board. This can likewise be problematic if several circuit boards are intended to be connected together directly using connectors fastened to each of the boards.

There is therefore a need for a cooling solution that is compatible with all of these problems.

SUMMARY OF THE INVENTION

An aim of the present disclosure is to overcome at least some of the drawbacks of the prior art.

An aim of the present disclosure is in particular to propose an electronic housing element comprising a radiator intended to cool a component of a circuit board that is easy to mount on the circuit board while ensuring that the circuit board is sealed effectively with respect to the electronic housing.

An electronic housing element intended to be fastened to a circuit board having a component to be cooled in order to form an electronic housing is proposed, said electronic housing element comprising:
- a frame made of plastics material having a rigid surround and an upper wall, and
- a radiator intended to cool the component when it is in thermal contact therewith, the radiator having:
  - a gripping portion protruding from the upper wall of the frame, said gripping portion being designed so as to be able to engage with gripping claws of a gripping device,
  - a holding portion intended to engage with the upper wall of the frame, the upper wall of the frame being formed from a material that has a deflection temperature under load and being designed to deform in order to allow the orientation of the radiator to be adjusted with respect to the surround of the frame when the upper wall reaches the deflection temperature under load.

The proposed housing element has the advantage of allowing the adjustment of the orientation of the radiator intended to be in contact with the component to be cooled when the upper wall of the frame, made of a thermoplastic material, is heated to above its deflection temperature under load. This thus ensures that the lower face of the radiator is suitably parallel to the component to be cooled and therefore that the thickness of thermal interface material is suitably uniform. Furthermore, if necessary, the distance between the lower face of the radiator and the component can also be adjusted so as to ensure that the thickness of the layer of thermal interface material is thin enough to ensure a suitable thermal performance in terms of cooling.

Furthermore, since the upper wall deforms when its temperature is greater than or equal to its deflection temperature under load, after cooling, permanent deformation is achieved without risks of cracks and without bringing about residual stress in the frame.

According to one embodiment, the frame is formed by being overmolded on the holding portion of the radiator.

The use of a process of overmolding on the holding portion of the radiator in order to produce the frame makes it possible to obtain a robust joint, adapted to the heavy vibrations to which the joint between the radiator and the frame can be subjected. Furthermore, the manufacture of the electronic housing element, and in particular the mounting of the radiator on the upper wall of the frame, is simplified. In addition, the use of the overmolding process makes it possible to ensure an effective seal, limiting the penetration of dust and water into the electronic housing. Advantageously, a thermoplastic resin is used to produce the frame by overmolding.

According to one embodiment, the upper wall has an undulating wall portion and, at its center, a portion configured to cooperate with the holding portion of the radiator.

Such a wall can easily be formed by overmolding, making it possible to have a good connection with the holding part of the radiator. Moreover, the small thickness of the wall and its undulating shape make it possible to limit heat transfer to the rest of the frame when the upper wall is heated. In this way, deformation of the rest of the frame is avoided. Moreover, the small thickness of the upper wall makes it possible to quickly reach the deflection temperature under load, thereby supporting a saving of time and energy.

Advantageously, the material forming the upper wall of the frame is chosen such that its deflection temperature under load is greater than a temperature reached by the electronic housing during operation.

This avoids a situation in which the upper wall of the frame deforms unintentionally when the electronic housing is installed and in operation. Misalignment of the radiator when the housing is mounted and in operation is thus avoided.

In one embodiment, the holding portion and the gripping portion of the radiator are formed from a thermally conducting material.

Thus, the holding portion and the gripping portion are in thermal contact, allowing better dissipation of heat by the radiator by increasing the surface areas for heat exchange.

In one embodiment, the holding portion of the radiator is in thermal contact with the upper wall of the frame.

Thus, the upper wall of the frame can be heated by conduction by the holding portion of the radiator being heated.

According to another aspect, a method for adjusting the orientation of a radiator included in an electronic housing element as described above is proposed, comprising:
  inserting the electronic housing element into a suitable holding device,
    measuring the orientation of a lower face of the radiator with respect to a reference plane,
    gripping the gripping portion of the radiator with gripping claws of a gripping device,
    heating the gripping claws of the gripping device in order to heat the upper wall of the frame by way of the radiator and monitoring the temperature of the upper wall of the frame,
    adjusting the orientation of the radiator with the aid of the gripping device when the upper wall of the frame reaches the deflection temperature under load,
    stopping the heating and the cooling of said claws while maintaining the adjusted orientation of the radiator.

The proposed adjusting method makes it possible to easily and inexpensively obtain an electronic housing having a radiator, the lower face of which is oriented parallel to a reference plane corresponding, for example, to a subsequent position of the surface of the component when the circuit board having the component is mounted. Specifically, the proposed adjusting method is less expensive than the production and selection of housing elements corresponding to positioning tolerances that are more demanding and not realizable as things stand. The proposed adjusting method is also easier and quicker to carry out than a method involving removal of material. Specifically, it is not necessary to carry out steps of milling, cleaning of lubricant and removing milling residues by ultrasound. In addition, this adjusting method can be incorporated easily into the assembly line and be carried out just before the fastening of the circuit board and of the cover to the frame.

According to another aspect, equipment for implementing the above-described method is proposed, the equipment comprising:
  a holding device intended to accommodate and hold the electronic housing element as described above,
  a detector configured to measure an orientation of a lower face, intended to be in thermal contact with the component to be cooled, of the radiator with respect to a reference plane,
  a temperature sensor configured to measure a temperature of the upper wall of the frame,
  a gripping device comprising:
  gripping claws intended to cooperate with the gripping portion of the radiator, and
  a system for heating and cooling said claws, said system being designed to heat the gripping claws to a temperature greater than the deflection temperature under load of the upper wall of the frame,
the gripping device being configured to be able to adjust the orientation of the radiator with respect to the reference plane.

BRIEF DESCRIPTION OF THE DRAWINGS

Further features, details and advantages will become apparent from reading the following detailed description and from studying the appended drawings, in which.

DESCRIPTION OF THE EMBODIMENTS

The drawings and description below primarily contain elements of certain character. Therefore, they may not only serve for better understanding of the present disclosure but also contribute to the definition thereof, as the case may be.

Figure 1A:
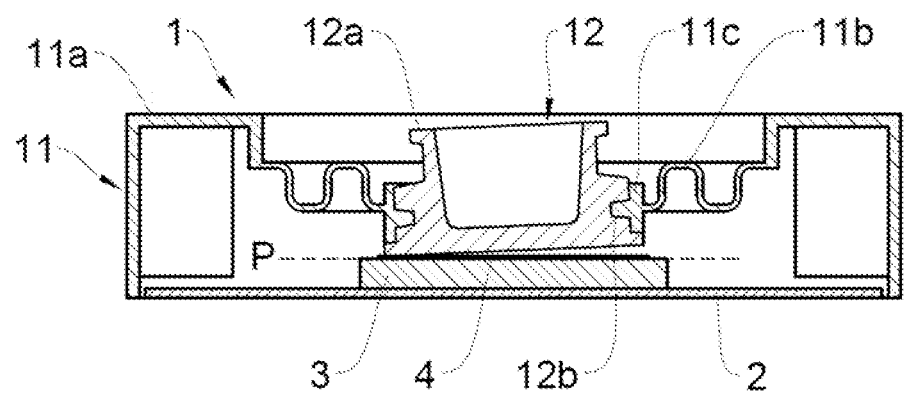
FIG. 1A shows a view in cross section of an electronic housing element before adjustment.
Figure 1B:
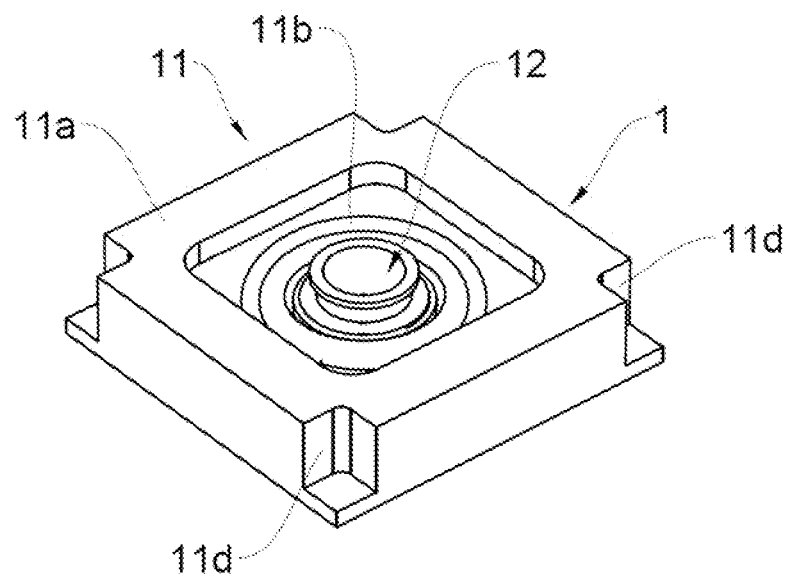
FIG. 1B shows a top view of the electronic housing element according to one embodiment.

Reference is now made to FIGS. 1A and 1B. FIG. 1A shows a housing element 1 intended to be mounted on a circuit board 2 having a component 3 to be cooled, the circuit board 2 being shown in a slightly offset position under the housing element 1 in order to be more visible. The electronic housing element 1 is intended to be closed by a cover (not shown) in order to form an enclosure, i.e. an electronic housing, enclosing the circuit board 2 and the component 3.

The electronic housing element 1 comprises a frame 11 and a radiator 12 intended to cool the component 3 when it is in thermal contact therewith, for example via a thermal interface layer 4 as shown schematically in FIG. 1A.

As can be seen more particularly in FIG. 1B in particular, the frame 11 is made of plastics material and has a rigid surround 11a and an upper wall 11b. The upper wall 11b has a central orifice in which the radiator 12 can be mounted.

As can be seen more particularly in FIG. 1A, the radiator 12 comprises a gripping portion 12a and a holding portion 12b thermally in the continuation of one another. The radiator 12 is formed from a thermally conducting material such as metal, for example. The holding portion 12b is located on an external wall at the periphery of the radiator 12 and is intended to engage with the upper wall 11b of the frame 11. The gripping portion 12a, which protrudes out of the electronic housing element, is intended to cooperate with gripping claws of a gripping device, as can be seen more particularly with reference to FIGS. 2b and 2c. The gripping portion 12a is therefore designed so as to be able to engage with the gripping claws of the gripping device. As can be seen more particularly in FIG. 1B, the radiator 12 has, on the portion protruding out of the electronic housing element, a recess intended to increase the surface area for heat exchange with the ambient air in order to cool the component 3.

In the embodiment described here, the upper wall 11b has an undulating shape and advantageously has a thickness very much less than its length and very much less than a height of one of the undulations of the upper wall.

The small thickness and the undulating shape of the upper wall 11b make it possible to limit heat transfer to the rest of the frame when the upper wall is heated. When the radiator exhibits symmetry of revolution, as is the case here, the upper wall 11b has concentric circles about the central orifice on which the radiator 12 is mounted, as can be seen more particularly in FIG. 1B.

As shown in FIG. 1A, it is apparent that the lower face of the radiator 12 is inclined with respect to the plane of the component 3 and of the circuit board 2. This can cause problems, in particular during the application of low-viscosity thermal paste or grease, which can spread out of the desired thermal contact zone between the component 3 and the radiator 12. In addition, since the distance between the lower face of the radiator 12 and the surface of the component 3 is not constant, the cooling performance is not satisfactory, as described above.

In order to overcome this, the solution proposed makes it possible to adjust the orientation of the radiator 12 in order that the lower face thereof is substantially parallel to the surface of the component, with the allowed mechanical tolerances, when the latter is mounted on the electronic housing element.

Thus, the material from which the upper wall 11b of the frame is formed is capable of deforming permanently when it is heated to a temperature greater than or equal to a deflection temperature under load that is inherent to the material used, and then cooled. It is thus possible, by applying a load to the radiator with the aid of the gripping device, to move it in order to adjust its orientation with respect to the surround of the frame, more specifically with respect to a reference plane P, and to fix this position when the upper wall 11b has cooled, as described in more detail with reference to FIGS. 2A to 2D. The reference plane may correspond for example to a reference orientation of the surface of the component 3 when the circuit board 2 is mounted on the frame 11.

In the embodiment described here, the frame 11 is made of thermoplastic resin and is formed by overmolding on the holding portion 12b of the radiator 12. It may be made of polypropylene, PC/ABS (polycarbonate/acrylonitrile butadiene styrene) blends or polycarbonates, for example. As shown in FIG. 1, the upper wall 11b has an undulating wall portion and, at its center, a fastening portion 11c configured to cooperate with the holding portion 12b of the radiator 12. In the example described here, the holding portion 12b of the radiator has a shape complementary to that of the fastening portion 11c of the upper wall 11b. One of the fastening portion 11c and the holding portion 12b has a recess while the other of the fastening portion 11c and the holding portion 12b has a protuberance that is accommodated in the corresponding recess. Thus, the production of the frame by overmolding makes it possible to obtain a robust joint between the radiator and the upper wall of the frame, which also exhibits a good seal. In this way, the penetration of water and dust at the level of the component is limited, with suitable robustness of the joint during vibrations being ensured.

Advantageously, the thermoplastic resin used has a deflection temperature under load greater than a maximum temperature that can be reached during the use of the component. For example, for this purpose, a thermoplastic resin having a deflection temperature under load greater than 105° C. is chosen in order to avoid maladjustment of the orientation of the radiator under nominal operating conditions, in particular when the temperature is 85° C. in the environment of the housing and the component contributes, during its operation, to an increase in temperature of 20° C. at the upper wall of the frame.

In one embodiment variant, the surround and the upper wall of the frame may be made of polycarbonate. Its deflection temperature under load is 120° C., which is very much above the temperature that can be reached when the electronic housing is mounted in its operating environment and the component is operating as described above.

FIGS. 2A to 2D illustrate different steps in a method for adjusting the orientation of the radiator 12 with respect to the frame 11.

Figure 2A:
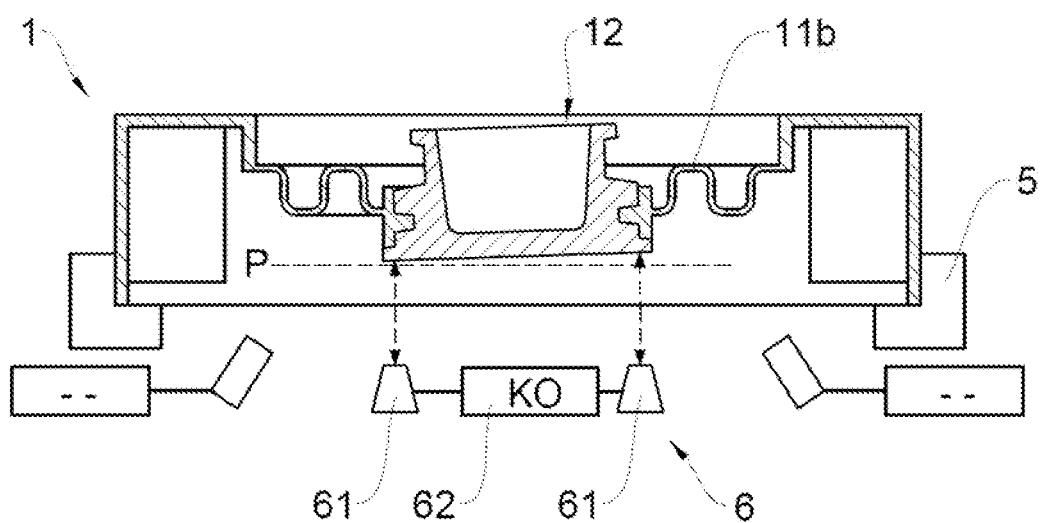
FIG. 2A illustrates a step in a method for adjusting the orientation of a radiator included in the electronic housing element from FIGS. 1A and 1B according to one embodiment.

First of all, the electronic housing element 1 is inserted into a suitable holding device 5 as illustrated in FIG. 2A, then a detector 6 measures the orientation of the lower face of the radiator 12 with respect to the reference plane P. The measurement of the orientation of the lower face of the radiator 12 with respect to the reference plane P makes it possible to determine if there is a discrepancy between the orientation of the lower face of the radiator and the provided orientation of the surface of the component 3 when the circuit board 2 is mounted on the frame 11. The detector 6 has for example three sensor heads 61 and a control and detection unit 62. The sensor heads 61 are configured to output light pulses and measure the intensity received after they have been reflected on the lower face of the radiator. The control and detection unit 62 is configured to determine a time of flight for each reflection of the signal output by each of the heads and to deduce therefrom an orientation of the internal face of the radiator 12 with respect to the reference plane P. The reference plane P may correspond to a reference orientation of the surface of the component 3 or of the circuit board 2 for example.

When the internal face of the radiator 12 is not oriented along the reference plane P, i.e. when at least one of the three angles defining the orientation of the lower face of the radiator 12 with respect to the reference plane P is greater than a threshold, a step of adjusting the orientation of the radiator is implemented, as described with reference to FIGS. 2B and 2C.

Figure 2B:
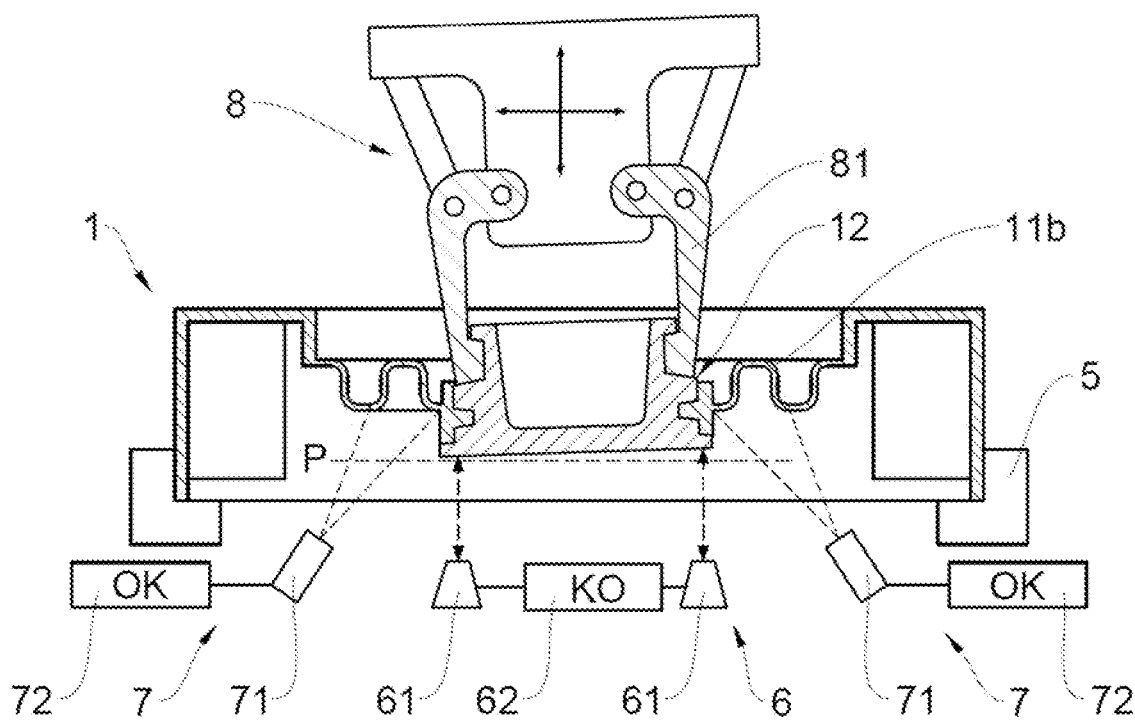
FIG. 2B illustrates a step in a method for adjusting the orientation of a radiator included in the electronic housing element from FIGS. 1A and 1B according to one embodiment.
Figure 2C:
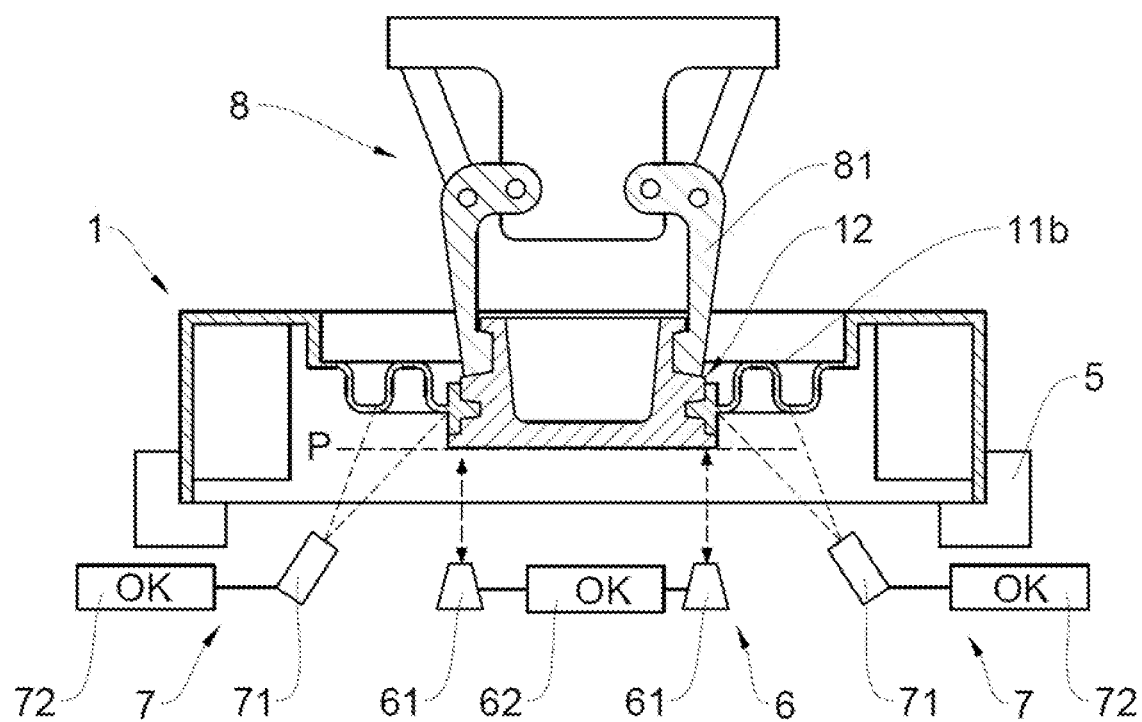
FIG. 2C illustrates a step in a method for adjusting the orientation of a radiator included in the electronic housing element from FIGS. 1A and 1B according to one embodiment.

First of all, a gripping device 8 is actuated such that gripping claws 81 engage with the gripping portion 12a of the radiator 12 (FIG. 2B).

Next, the gripping claws 81 are heated. The gripping claws 81, which are thermally conducting, make it possible to heat the radiator 12 and then the upper face 11b of the frame by conduction. This is made possible by the fact that the gripping portion 12a and the holding portion 12b are thermally in the continuation of one another and that the holding portion 12b is in thermal contact with the upper wall 11b of the frame. In addition, the deflection temperature under load is reached rapidly on account of the small thickness of the upper wall. It will be noted that the radiator 12 is in thermal contact only with the upper wall 11b of the frame here. Thus, the heat can propagate to the rest of the frame only via the upper wall 11b. Since, furthermore, the upper wall 11b is relatively thin (around 0.7 to 1.5 mm for example), the amount of heat transmitted to the surround 11a of the frame is relatively small. Deformation of the surround of the frame by an effect of relaxation of the stresses fixed during overmolding is thus avoided.

During heating, the temperature of the upper wall 11b of the frame 11 is monitored by at least one temperature sensor 7. In the example described here, two temperature sensors 7 are shown in FIG. 2B. These may be for example infrared detectors 71 that are each connected to a control and measurement unit 72.

When the deflection temperature under load is reached, the gripping device 8 is actuated so as to adjust the orientation of the lower face of the radiator 12. It will be noted that the values measured by the control and detection unit 62 of the orientation detector 6 are transmitted to the control unit of the robotic claw for the feedback control of the orientation of the gripping device and the movement thereof, as the case may be.

Figure 2D:
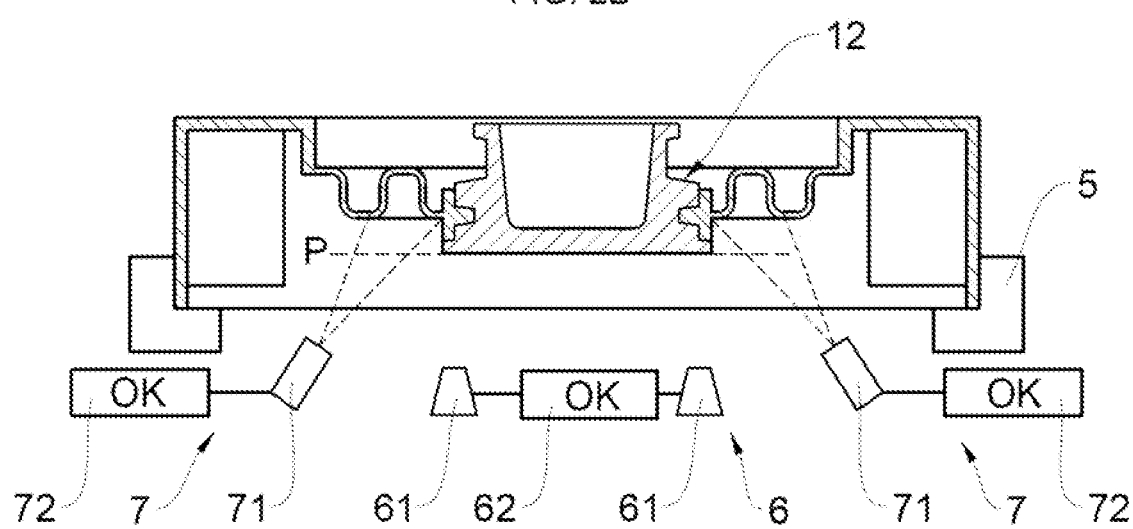
FIG. 2D illustrates a step in a method for adjusting the orientation of a radiator included in the electronic housing element from FIGS. 1A and 1B according to one embodiment.

When the orientation of the radiator is adjusted (FIG. 2C), that is to say when the orientation detector 6 detects that the orientation of the lower face of the radiator 12 corresponds to that of the reference plane P, the heating of the gripping claws is stopped and the upper wall 11b of the frame can then cool in order to fix the new orientation of the radiator 12 with respect to the frame. Specifically, the deformation under stress of the upper wall 11b that is brought about by the gripping device becomes permanent during cooling. To accelerate the cooling, the gripping claws 81 are thermally coupled to a cooling system. Advantageously, the temperature of the upper wall 11b is measured during cooling such that the gripping claws 81 can be decoupled from the gripping portion 12a of the radiator when the temperature of the upper wall 11b is less than a threshold (FIG. 2D). In addition, the orientation of the radiator is verified, for example during a final test, before mounting the circuit board 2 on the electronic housing element 1 to form the electronic housing 10, as illustrated with reference to FIG. 3.

The equipment for implementing the above-described adjustment method has been described in part with reference to FIGS. 2A to 2D. In one embodiment, the equipment comprises:
  the holding device 5 intended to accommodate and hold the electronic housing element 1,
  the detector 6 configured to measure the orientation of the lower face, intended to be in thermal contact with the component to be cooled, of the radiator with respect to the reference plane P,
  at least one temperature sensor 7 configured to measure a temperature of the upper wall 11b of the housing,
  the gripping device 8 comprising:
  gripping claws 81 intended to cooperate with the gripping portion 12a of the radiator, and
  a system (not shown) for heating and cooling said claws, said system being designed to heat the gripping claws 81 to a temperature greater than the deflection temperature under load of the upper wall of the frame. The gripping claws 81 are made of a thermally conducting material and are thermally coupled to the heating and cooling system. The heating and cooling system may comprise a system for circulating heated or cooled fluid. The heating and cooling system may also comprise heating and cooling elements. The heating and cooling elements may also be in direct thermal contact with the gripping claws.

The gripping device 8 also comprises a control unit (not shown) configured to control the gripping claws 81 and the movement of the gripping device 8 in order to adjust the orientation of the radiator 12 with respect to the reference plane P. The control unit is also configured to control the temperature of the gripping claws 81 via the heating and cooling system.

Advantageously, the gripping device 8, and more particularly the control unit thereof, is connected to the control and detection unit 62 of the detector 6, and to the control and measurement unit 72 of the temperature sensor 7. Thus, the control unit of the gripping device 8 is also configured to monitor the temperature of the upper wall 11b and the orientation of the lower face of the radiator 12.

Figure 3:
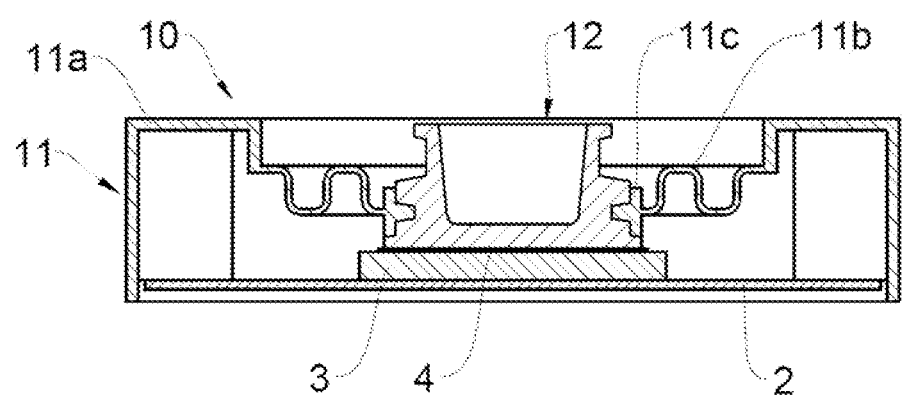
FIG. 3 shows a view in cross section of an electronic housing element from FIG. 1 positioned on a circuit board after adjustment, according to one embodiment.

FIG. 3 shows the electronic housing element 1 positioned on the circuit board 2 following adjustment of the orientation of the radiator 12 with respect to the reference plane P using the adjustment method described with reference to FIGS. 2A to 2D.

In the embodiment described here, the circuit board 2 comes to bear on the lower face of the surround 11a and is intended to be fastened to the surround 11a via screws or clips (not shown) for example fastened to the walls formed by the recesses 11d provided for this purpose, as can be seen more particularly in FIG. 1B.

The mounting of the circuit board 2 on the electronic housing element is simplified since it is not necessary to fasten the radiator 12 to the circuit board 2 as proposed in the prior art and since the position of the circuit board 2 is defined with respect to the frame. Furthermore, since the radiator 12 is already mounted on the housing element, the number of parts to be kept in store and the number of steps to be carried out when mounting the electronic housing are limited.

This solution is therefore particularly suitable for the cooling of components mounted on small circuit boards. It will be noted that this solution is also particularly suitable if several circuit boards are intended to be connected together directly using connectors fastened to each of the boards, since the position of the radiator is defined with respect to the frame.

The present disclosure is not limited to the example of a radiator exhibiting symmetry of revolution and of an upper wall with concentric circles as described above with reference to FIG. 1B, only by way of example, but encompasses all the variants that a person skilled in the art may envision within the scope of protection desired.

The invention claimed is:

1. An electronic housing element intended to be fastened to a circuit board having a component to be cooled in order to form an electronic housing, said electronic housing element comprising: a frame made of plastics material having a rigid surround and an upper wall; and a radiator intended to cool the component when in thermal contact therewith, the radiator having: a gripping portion protruding from the upper wall of the frame, said gripping portion being designed so as to be able to engage with gripping claws of a gripping device, and a holding portion intended to engage with the upper wall of the frame, the upper wall of the frame being formed from a material that has a deflection temperature under load and being designed to deform in order to allow an orientation of the radiator to be adjusted with respect to the surround of the frame when the upper wall reaches the deflection temperature under load.

2. The electronic housing element as claimed in claim 1, wherein the frame is formed by being overmolded on the holding portion of the radiator.

3. The electronic housing element as claimed in claim 2, wherein the upper wall has an undulating wall portion and a center; a portion configured to cooperate with the holding portion of the radiator.

4. The electronic housing element as claimed in claim 1, wherein the material forming the upper wall of the frame is chosen such that the deflection temperature under load is greater than a temperature reached by the electronic housing during operation.

5. The electronic housing element as claimed in claim 1, wherein the holding portion and the gripping portion of the radiator are formed from a thermally conducting material.

6. The electronic housing element as claimed in claim 5, wherein the holding portion of the radiator is in thermal contact with the upper wall of the frame.

7. A method for adjusting an orientation of a radiator included in an electronic housing element according to claim 1, comprising:
   inserting the electronic housing element into a suitable holding device;
   measuring the orientation of a lower face of the radiator with respect to a reference plane;
   gripping the gripping portion of the radiator with gripping claws of a gripping device;
   heating the gripping claws of the gripping device in order to heat the upper wall of the frame by way of the radiator and monitoring the temperature of the upper wall of the frame;
   adjusting the orientation of the radiator with the aid of the gripping device when the upper wall of the frame reaches the deflection temperature under load; and
   stopping the heating and the cooling of said claws while maintaining the adjusted orientation of the radiator.

8. Equipment for implementing the method as claimed in claim 7, the equipment comprising:
   a holding device intended to accommodate and hold the electronic housing element;
   a detector configured to measure an orientation of a lower face, intended to be in thermal contact with the component to be cooled, of the radiator with respect to a reference plane;
   a temperature sensor configured to measure a temperature of the upper wall of the frame;
   a gripping device comprising:
   gripping claws intended to cooperate with the gripping portion of the radiator; and
   a system for heating and cooling said claws, said system being designed to heat the gripping claws to a temperature greater than the deflection temperature under load of the upper wall of the frame,
the gripping device being configured to be able to adjust the orientation of the radiator with respect to the reference plane.

* * * * *